United States Patent
Kim et al.

(10) Patent No.: US 10,553,660 B2
(45) Date of Patent: Feb. 4, 2020

(54) LIGHT EMITTING DISPLAY DEVICE

(71) Applicant: SAMSUNG DISPLAY CO., LTD., Yongin-si, Gyeonggi-Do (KR)

(72) Inventors: Taeyoung Kim, Seongnam-si (KR); Heejin Kim, Hwaseong-si (KR); Jongwoo Park, Seongnam-si (KR); Daeyoun Cho, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 16/174,486

(22) Filed: Oct. 30, 2018

(65) Prior Publication Data
US 2019/0237526 A1 Aug. 1, 2019

(30) Foreign Application Priority Data
Jan. 26, 2018 (KR) ........................ 10-2018-0010164

(51) Int. Cl.
*H01L 51/52* (2006.01)
*H01L 27/32* (2006.01)
*H01L 33/38* (2010.01)

(52) U.S. Cl.
CPC ...... *H01L 27/3246* (2013.01); *H01L 27/3258* (2013.01); *H01L 27/3262* (2013.01); *H01L 33/387* (2013.01)

(58) Field of Classification Search
None
See application file for complete search history.

(56) References Cited

U.S. PATENT DOCUMENTS

2014/0175396 A1* 6/2014 Lee .................. H01L 51/56 257/40
2018/0374909 A1* 12/2018 Nishikiori .......... H01L 27/3223

FOREIGN PATENT DOCUMENTS

| KR | 10-2008-0002526 A | 1/2008 |
| KR | 10-2012-0077473 A | 7/2012 |
| KR | 10-2014-0141382 A | 12/2014 |
| KR | 10-2016-0141251 A | 12/2016 |
| KR | 10-2017-0066771 A | 6/2017 |
| KR | 10-2017-0071974 A | 6/2017 |

OTHER PUBLICATIONS

Seungjun Chung, et al., Substrate thermal conductivity effect on heat dissipation and lifetime improvement of organic light-emitting diodes, Applied Physics Letters 94, 253302-01—03, 2009.

\* cited by examiner

*Primary Examiner* — Grant S Withers
(74) *Attorney, Agent, or Firm* — Kile Park Reed & Houtteman PLLC

(57) ABSTRACT

An organic light emitting display (OLED) device includes a substrate having a display region including a plurality of sub-pixel regions, a respective driving transistor and a respective switching transistor on the substrate in each of the sub-pixel regions, an insulation layer structure on the substrate, the insulation layer structure having a respective trench surrounding the driving transistor in each of the sub-pixel regions, and a respective sub-pixel structure on the insulation layer structure in each of the sub-pixel regions.

19 Claims, 13 Drawing Sheets

LIGHT EMITTING DISPLAY DEVICE

CROSS-REFERENCE TO RELATED APPLICATION

Korean Patent Applications No. 10-2018-0010164, filed on Jan. 26, 2018, in the Korean Intellectual Property Office, and entitled: "Light Emitting Display Device," is incorporated by reference herein in its entirety.

BACKGROUND

1. Field

Embodiments relate to a light emitting display device.

2. Description of the Related Art

A flat panel display (FPD) device is widely used as a display device of an electronic device because the FPD device is lightweight and thin compared to a cathode-ray tube (CRT) display device. Typical examples of the FPD device are a liquid crystal display (LCD) device and an organic light emitting display (OLED) device.

SUMMARY

Embodiments are directed to an organic light emitting display (OLED) device, including a substrate having a display region including a plurality of sub-pixel regions, a respective driving transistor and a respective switching transistor on the substrate in each of the sub-pixel regions, an insulation layer structure on the substrate, the insulation layer structure having a respective trench surrounding the driving transistor in each of the sub-pixel regions, and a respective sub-pixel structure on the insulation layer structure in each of the sub-pixel regions.

In the sub-pixel regions, the driving transistor may be surrounded by the trench, and the switching transistor may be outside the trench.

The insulation layer structure may include a first insulation layer pattern surrounded by the trench, and a second insulation layer pattern outside the trench, the second insulation layer pattern being spaced apart from the first insulation layer pattern by the trench.

The trench may extend along an outer profile of the driving transistor.

The trench may expose a portion of an upper surface of the substrate.

The OLED device may further include a planarization layer on the driving and switching transistors and the insulation layer structure, the planarization layer filling the trench and being in contact with the exposed portion of the upper surface of the substrate.

A thermal conductivity of the planarization layer may be less than a thermal conductivity of the insulation layer structure.

The insulation layer structure may include a buffer layer on the substrate, the buffer layer having a respective first opening surrounding each of the driving transistors, a gate insulation layer on the buffer layer, the gate insulation layer having a respective second opening overlapping a corresponding first opening and surrounding a corresponding driving transistor, and an insulating interlayer on the gate insulation layer, the insulating interlayer having a respective third opening overlapping a corresponding second opening and surrounding a corresponding driving transistor.

The first, second, and third openings in one sub-pixel region may collectively define the trench in the one sub-pixel region.

The plurality of sub-pixel regions may include first through (M)th sub-pixel regions, where M is an integer greater than 1, the driving transistors may include first through (N)th driving transistors in the first through (M)th sub-pixel regions, respectively, where N is an integer greater than 1, and the trenches may include first through (L)th trenches surrounding the first through (N)th driving transistors, respectively, where L is an integer greater than 1.

A (J)th driving transistor among the first through (N)th driving transistors may be in a (K)th sub-pixel region among the first through (M)th sub-pixel regions, where J is an integer between 1 and N, and K is an integer between 1 and M, and an (I)th trench among the first through (L)th trenches may surround the (J)th driving transistor, where I is an integer between 1 and L.

The insulation layer structure may further include first outer trenches, a respective first outer trench being along a boundary of each of the sub-pixel regions on the substrate.

The first outer trenches may not overlap each other and may be spaced apart from each other.

The plurality of sub-pixel regions may include first through (M)th sub-pixel regions, where M is an integer greater than 1, (K−1)th, (K)th, and (K+1)th sub-pixel regions among the first through (M)th sub-pixel regions may collectively define an (H)th pixel region, where K is an integer between 1 and M, and H is an integer between 1 and M/3, and the insulation layer structure may further include second outer trenches, a respective second outer trench being along a boundary of each of the pixel regions.

The second outer trenches may not overlap each other and may be spaced apart from each other.

The substrate may include a first organic layer, a first barrier layer on the first organic layer, a second organic layer on the first barrier layer, and a second barrier layer on the second organic layer, and a portion of an upper surface of the second barrier layer may be exposed by the trench.

The OLED device may further include a conductive layer between the second organic layer and the second barrier layer.

Each sub-pixel structure may include a lower electrode on the insulation layer structure, a light emitting layer on the lower electrode, and an upper electrode on the light emitting layer.

The OLED device may further include a thin film encapsulation structure on the sub-pixel structures, and the substrate and the thin film encapsulation structure may each have flexibility.

The thin film encapsulation structure may includes a first thin film encapsulation layer on the sub-pixel structures, the first thin film encapsulation layer including inorganic materials, a second thin film encapsulation layer on the first thin film encapsulation layer, the second thin film encapsulation layer including organic materials, and a third thin film encapsulation layer on the second thin film encapsulation layer, the third thin film encapsulation layer including the inorganic materials.

BRIEF DESCRIPTION OF THE DRAWINGS

Features will become apparent to those of skill in the art by describing in detail example embodiments with reference to the attached drawings in which.

DETAILED DESCRIPTION

Figure 1:
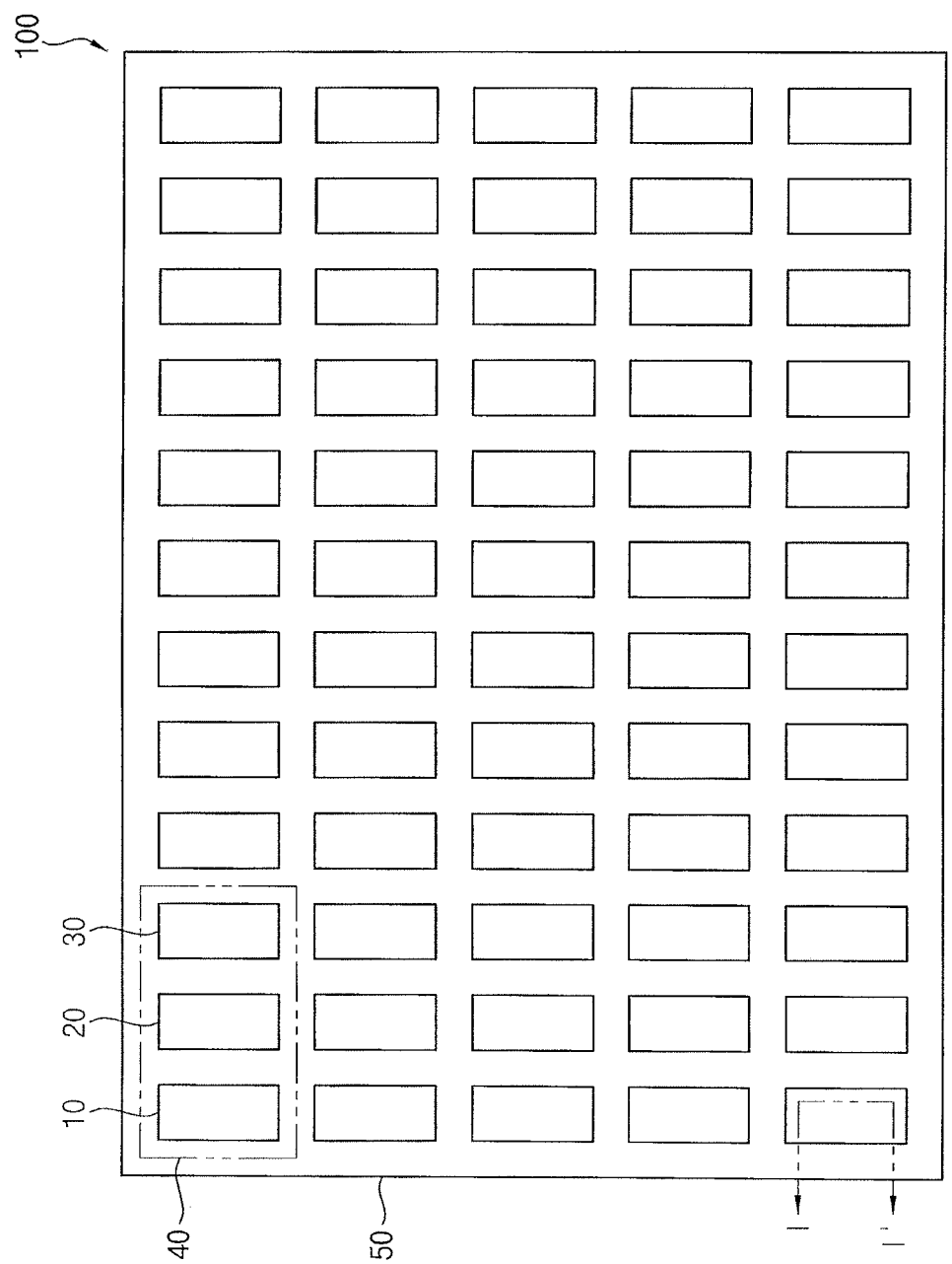
FIG. 1 illustrates a plan view of an organic light emitting display (OLED) device in accordance with an example embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey example implementations to those skilled in the art. In the drawing figures, the dimensions of layers and regions may be exaggerated for clarity of illustration. Like reference numerals refer to like elements throughout.

Figure 2:
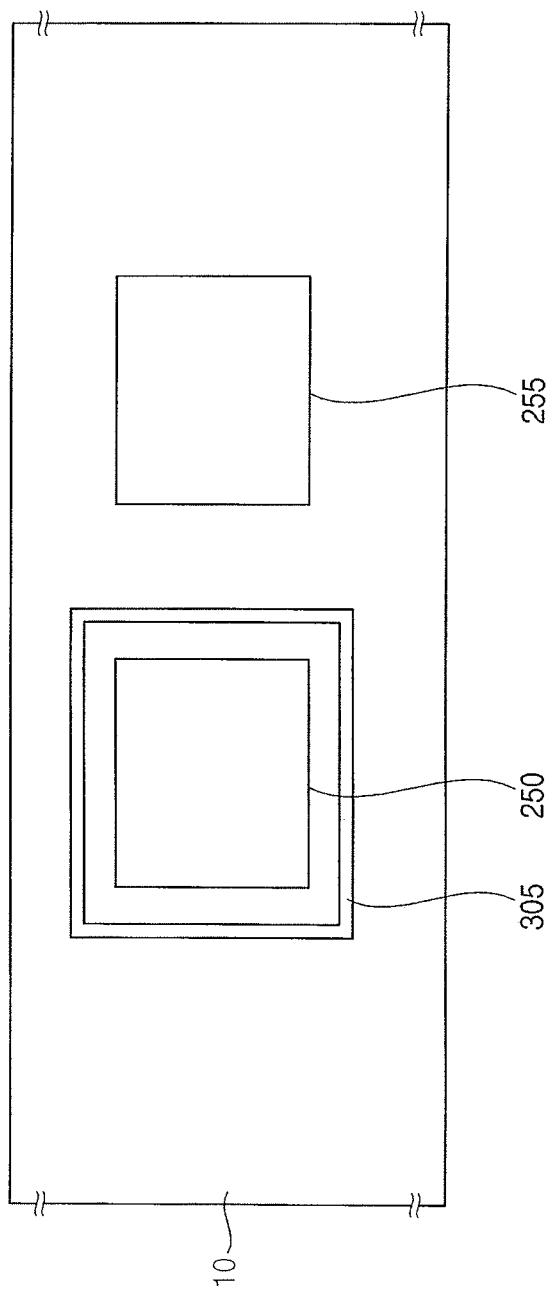
FIG. 2 illustrates a plan view for describing a trench included in the OLED device of FIG. 1.

FIG. 1 illustrates a plan view of an organic light emitting display (OLED) device in accordance with an example embodiment, and FIG. 2 illustrates a plan view for describing a trench included in the OLED device of FIG. 1.

Referring to FIGS. 1 and 2, an organic light emitting display (OLED) device 100 may have a display region 50 including a plurality of pixel regions 40 and a plurality of sub-pixel regions 10, 20, and 30. The pixel regions 40 may be entirely arranged in a first direction that is in parallel to an upper surface of the OLED device 100 and a second direction that is perpendicular to the first direction in the display region 50. In addition, each of the pixel regions 40 may include the sub-pixel regions 10, 20, and 30, and three sub-pixel regions may be defined as one pixel region.

For example, a plurality of the sub-pixel regions may include first through (M)th sub-pixel regions, where M is an integer greater than 1. (K−1)th, (K)th, and (K+1)th sub-pixel regions among the first through (M)th sub-pixel regions may be defined as an (H)th pixel region. Here, K is an integer between 1 and M, and H is an integer between 1 and M/3.

In an example embodiment, one pixel region may include three sub-pixel regions. In another implementation, one pixel region may include two sub-pixel regions, or four or more sub-pixel regions.

Respective sub-pixel structures (e.g., a sub-pixel structure 200 of FIG. 3) may be in each of the sub-pixel regions 10, 20, and 30, respectively. For example, the sub-pixel structure in the sub-pixel region 10 may emit a red color of light, the sub-pixel structure in the sub-pixel region 20 may emit a green color of light, and the sub-pixel structure in the sub-pixel region 30 may emit a blue color of light. Wirings may be in a remaining portion of the display region 50 except for the sub-pixel regions 10, 20, and 30. For example, the wirings may include data signal wirings, scan signal wirings, light emission signal wirings, initialization signal wirings, power supply voltage wirings, etc.

In addition, at least one driving transistor 250 and at least one switching transistor 255 may be in each of the sub-pixel regions 10, 20, and 30. In an example embodiment, a respective trench surrounding the driving transistor 250 may be formed in each of the sub-pixel regions 10, 20, and 30. For example, as illustrated in FIG. 2, a trench 305 may be formed along an outer profile of the driving transistor 250 in the sub-pixel region 10.

A plurality of sub-pixel regions may include first through (M)th sub-pixel regions, where M is an integer greater than 1. The driving transistors may include first through (N)th driving transistors in the first through (M)th sub-pixel regions, respectively, where N is an integer greater than 1. The trenches may include first through (L)th trenches surrounding the first through (N)th driving transistors, respectively, where L is an integer greater than 1. Here, (J)th driving transistor among the first through (N)th driving transistors may be in (K)th sub-pixel region among the first through (M)th sub-pixel regions. J is an integer between 1 and N, and K is an integer between 1 and M. An (I)th trench among the first through (L)th trenches may surround the (0.1)th driving transistor, where I is an integer between 1 and L.

In an example embodiment, a shape (in plan view) of each of the sub-pixel regions 10, 20, and 30, the pixel region 40, the display region 50, the driving transistor 250, the switching transistor 255, and the trench 305 may be tetragonal. In other implementations, for example, a shape (in plan view) of each of the sub-pixel regions 10, 20, and 30, the pixel region 40, the display region 50, the driving transistor 250, the switching transistor 255, and the trench 305 may be triangular, a diamond shape, polygonal, circular, oval, elliptical, etc.

Figure 3:
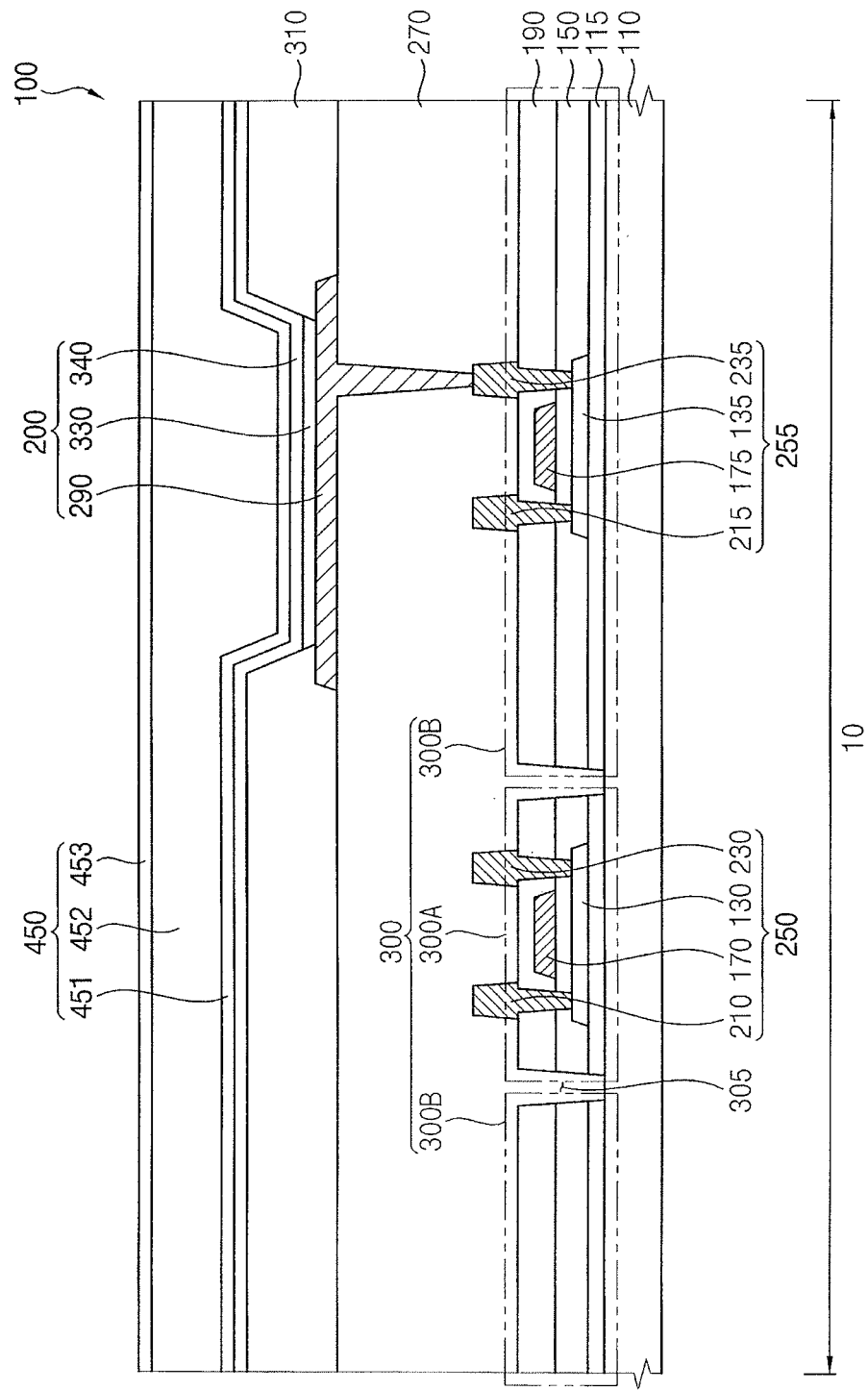
FIG. 3 illustrates a cross-sectional view taken along a line I-I' of FIG. 1.

In example embodiment illustrated in FIG. 3, the OLED device 100 has the trench 305 surrounding the driving transistor 250. In another implementation, the OLED device 100 may have a plurality of grooves surrounding the driving transistor 250. The grooves may surround the driving transistor 250, and may be spaced apart from each other. In an embodiment, the grooves may overlap each other and may be integrally formed such that the overlapped grooves formed along an outer profile of the driving transistor 250 define the trench 305.

The trench 305 in the display region 10 may prevent a heat generated from the driving transistor 250 from being transmitted to the switching transistor 255 in the sub-pixel region 10 or the driving and switching transistor 250 and 255 in the adjacent sub-pixel regions (e.g., other sub-pixel regions are adjacent to the sub-pixel region 10). In an example embodiment, as the OLED device 100 includes the trench 305 surrounding the driving transistor 250, and the heat generated from the driving transistor 250 may not be transmitted to adjacent transistors (e.g., other transistors are adjacent to the driving transistor 250). Thus, the adjacent transistors may be prevented from deteriorating due to heat generated by the driving transistor 250.

FIG. 3 illustrates a cross-sectional view taken along a line I-I' of FIG. 1.

Referring to FIG. 3, the OLED device 100 may include a substrate 110, a buffer layer 115, a gate insulation layer 150, an insulating interlayer 190, the driving transistor 250, the switching transistor 255, the trench 305, a planarization layer 270, a pixel defining layer 310, a sub-pixel structure 200, a thin film encapsulation (TFE) structure 450, etc. The driving transistor 250 may include a first active layer 130, a first gate electrode 170, a first source electrode 210, and a first drain electrode 230. The switching transistor 255 may include a second active layer 135, a second gate electrode 175, a second source electrode 215, and a second drain electrode 235. The sub-pixel structure 200 may include a lower electrode 290, a light emitting layer 330, and an upper electrode 340. The TFE structure 450 may include a first TFE layer 451, a second TFE layer 452, and a third TFE layer 453. The buffer layer 115, the gate insulation layer 150, and the insulating interlayer 190 may be collectively defined as an insulating layer structure 300. As shown in FIG. 3, the insulating layer structure 300 may include a first insulation layer pattern 300A defined to be inside or surrounded by the trench 305, and a second insulation layer pattern 300B defined to be outside or beyond the boundary of the trench 305.

The substrate 110 may include transparent or opaque insulation materials. The substrate 110 may include a flexible transparent resin substrate. In an example embodiment, the substrate 110 may have a configuration where a first organic layer, a first barrier layer, a second organic layer, and a second barrier layer are sequentially stacked. The first barrier layer and the second barrier layer each may include inorganic materials such as silicon oxide, etc. In addition, the first organic layer and the second organic layer each may include organic materials such as a polyamide-based resin. In an example embodiment, each of the first and second barrier layers may block moisture or water that may permeate through the first and second organic layers.

The substrate 110 may be relatively thin and flexible. Thus, the substrate 110 may be disposed, e.g., temporarily disposed, on a rigid glass substrate to help support the formation of the driving transistor 250, the switching transistor 255, and the sub-pixel structure 200. In manufacturing the OLED device 100, after the buffer layer 115 is formed on the second barrier layer of the substrate 110, the driving transistor 250, the switching transistor 255, and the sub-pixel structure 200 may then be formed on the buffer layer 115. After the driving transistor 250, the switching transistor 255, and the sub-pixel structure 200 are formed on the buffer layer 115, the rigid glass substrate, on which the substrate 110 is temporality disposed, may be removed. It may be difficult to directly form the driving transistor 250, the switching transistor 255, and the sub-pixel structure 200 on the substrate 110 when the substrate 110 is relatively thin and flexible. Accordingly, the driving transistor 250, the switching transistor 255, and the sub-pixel structure 200 may be formed on the substrate 110 and the rigid glass substrate, and then the substrate 110 including the first organic layer, the first barrier layer, the second organic layer, and the second barrier layer may serve as the substrate 110 of the OLED device 100 after the removal of the rigid glass substrate. In another implementation, the substrate 110 may include a quartz substrate, a synthetic quartz substrate, a calcium fluoride substrate, a fluoride-doped quartz substrate, a soda lime glass substrate, a non-alkali glass substrate etc.

In an example embodiment, the substrate 110 may include four-layers. In another implementation, for example, the substrate 110 may include a single layer or a plurality of layers.

The buffer layer 115 may be on the substrate 110. In an example embodiment, as shown in FIG. 3, the buffer layer 115 may have a first opening surrounding the driving transistor 250. The buffer layer 115 may prevent the diffusion of metal atoms and/or impurities from the substrate 110 into the driving transistor 250, the switching transistor 255, and the sub-pixel structure 200. In addition, the buffer layer 115 may control a rate of a heat transfer in a crystallization process for forming the first active layer 130 and the second active layer 135, thereby helping to obtain substantially uniform active layers. Further, the buffer layer 115 may improve a surface flatness of the substrate 110 when a surface of the substrate 110 is relatively irregular. According to a type of the substrate 110, at least two buffer layers may be provided on the substrate 110, or the buffer layer may not be disposed. The buffer layer 115 may include, for example, organic materials or inorganic materials.

The first active layer 130 and the second active layer 135 may be on the buffer layer 115. The first active layer 130 and the second active layer 135 may be spaced apart from each other, e.g., in a lateral direction as shown in FIG. 3. In an example embodiment, the first active layer 130 may be inside or surrounded by the trench 305, and the second active layer 135 may be outside or beyond the trench 305. Each of the first and second active layers 130 and 135 may include an oxide semiconductor, an inorganic semiconductor (e.g., amorphous silicon, polysilicon, etc.), an organic semiconductor, etc.

The gate insulation layer 150 may be on the first and second active layers 130 and 135 and the buffer layer 115. In an example embodiment, the gate insulation layer 150 may have a second opening surrounding the driving transistor 250, and the second opening may overlap the first opening, e.g., so as to be aligned with the first opening in a stacking direction of the gate insulation layer 150 and the buffer layer as shown in FIG. 3. The gate insulation layer 150 may cover the first and second active layers 130 and 135 on the buffer layer 115, and may be on the entire buffer layer 115. For example, the gate insulation layer 150 may cover the first and second active layers 130 and 135 on the buffer layer 115, and may have a substantially flat upper surface without a step around the first and second active layers 130 and 135. In another implementation, the gate insulation layer 150 may cover the first and second active layers 130 and 135 on the buffer layer 115, and may be as a substantially uniform thickness along a profile of the first and second active layers 130 and 135. The gate insulation layer 150 may include silicon compound, metal oxide, etc. For example, the gate insulation layer 150 may include silicon oxide (SiOx), silicon nitride (SiNx), silicon oxynitride (SiOxNy), silicon oxycarbide (SiOxCy), silicon carbon nitride (SiCxNy), aluminum oxide (AlOx), aluminum nitride (AlNx), tantalum oxide (TaOx), hafnium oxide (HfOx), zirconium oxide (ZrOx), titanium oxide (TiOx), etc.

The first gate electrode 170 and the second gate electrode 175 may be on the gate insulation layer 150, and may be spaced apart from each other in the lateral direction orthogonal to the stacking direction. In an example embodiment, the first gate electrode 170 may be inside or surrounded by the trench 305, and the second gate electrode 175 may be outside or beyond the trench 305. Thus, the first gate electrode 170 may be on a portion of the gate insulation layer 150 under which the first active layer 130 is located, and the second gate electrode 175 may be on a portion of the gate insulation layer 150 under which the second active layer 135 is located. Each of the first and second gate electrodes 170 and 175 may include a metal, a metal alloy, metal nitride, conductive metal oxide, transparent conductive materials, etc. For example, each of the first and second gate electrodes 170 and 175 may include gold (Au), silver (Ag), aluminum (Al), tungsten (W), copper (Cu), platinum (Pt), nickel (Ni), titanium (Ti), palladium (Pd), magnesium (Mg), calcium (Ca), lithium (Li), chromium (Cr), tantalum (Ta), molybdenum (Mo), scandium (Sc), neodymium (Nd), iridium (Ir), an alloy of aluminum, aluminum nitride (AlNx), an alloy of silver, tungsten nitride (WNx), an alloy of copper, an alloy of molybdenum, titanium nitride (TiNx), chrome nitride (CrNx), tantalum nitride (TaNx), strontium ruthenium oxide (SRO), zinc oxide (ZnOx), indium tin oxide (ITO), stannum oxide (SnOx), indium oxide (InOx), gallium oxide (GaOx), indium zinc oxide (IZO), etc. These may be used alone or in a suitable combination thereof. In another implementation, each of the first and second gate electrodes 170 and 175 may have a multi-layered structure including a plurality of layers.

The insulating interlayer 190 may be on the first and second gate electrodes 170 and 175 and the gate insulation layer 150. In an example embodiment, the insulating interlayer 190 may have a third opening surrounding the driving transistor 250, and the third opening may overlap the first and second openings, e.g., so as to be aligned therewith in the stacking direction. The insulating interlayer 190 may cover the first and second gate electrodes 170 and 175 on the gate insulation layer 150, and may be on the entire gate insulation layer 150. For example, the insulating interlayer 190 may cover the first and second gate electrodes 170 and 175 on the gate insulation layer 150, and may have a substantially flat upper surface without a step around the first and second gate electrodes 170 and 175. In another implementation, the insulating interlayer 190 may cover the first and second gate electrodes 170 and 175 on the gate insulation layer 150, and may be as a substantially uniform thickness along a profile of the first and second gate electrodes 170 and 175. The insulating interlayer 190 may include silicon compound, metal oxide, etc.

As described above, the buffer layer 115, the gate insulation layer 150, and the insulating interlayer 190 may be collectively defined as the insulating layer structure 300, and the first through third openings may collectively define the trench 305. In addition, a portion of the insulating layer structure 300 inside or surrounded by the trench 305 may be denoted a first insulation layer pattern 300A, and a portion of the insulating layer structure 300 outside or beyond the boundary of the trench 305 may be denoted a second insulation layer pattern 300B. The first insulation layer pattern 300A may be spaced apart from the second insulation layer pattern 300B, and may have a discrete or island shape.

In an example embodiment, the trench 305 may expose a portion of an upper surface of the substrate 110. Thus, all of the inorganic insulation layers may be removed in a portion where the trench 305 is formed. In another implementation, the trench 305 may be formed by removing a portion of the insulating layer structure 300 such that the trench 305 surrounds the driving transistor 250 while not exposing the upper surface of the substrate 110.

The first source electrode 210, the first drain electrode 230, the second source electrode 215, and the second drain electrode 235 may be on the insulating interlayer 190. In an example embodiment, the first source electrode 210 and the first drain electrode 230 may be inside or surrounded by the trench 305, and the second source electrode 215 and the second drain electrode 235 may be outside the trench 305. The first source electrode 210 may be in contact with a source region of the first active layer 130 via a contact hole formed by removing a first portion of the gate insulation layer 150 and the insulating interlayer 190, and the first drain electrode 230 may be in contact with a drain region of the first active layer 130 via a contact hole formed by removing a second portion of the gate insulation layer 150 and the insulating interlayer 190. In addition, the second source electrode 215 may be in contact with a source region of the second active layer 135 via a contact hole formed by removing a third portion of the gate insulation layer 150 and the insulating interlayer 190, and the second drain electrode 235 may be in contact with a drain region of the second active layer 135 via a contact hole formed by removing fourth portion of the gate insulation layer 150 and the insulating interlayer 190. Each of the first and second source electrodes 210 and 215 and the first and second drain electrodes 230 and 235 may include a metal, an alloy, metal nitride, conductive metal oxide, transparent conductive materials, etc. These may be used alone or in a suitable combination thereof. In another implementation, each of the first and second source electrodes 210 and 215 and the first and second drain electrodes 230 and 235 may have a multi-layered structure including a plurality of layers. Accordingly, the driving transistor 250 including the first active layer 130, the first gate electrode 170, the first source electrode 210, and the first drain electrode 230 may be constituted, and the switching transistor 255 including the second active layer 135, the second gate electrode 175, the second source electrode 215, and the second drain electrode 235 may be constituted.

In an example embodiment, the OLED device 100 includes two transistors (e.g., the driving transistor 250 and the switching transistor 255). In another implementation, for example, the OLED device 100 may include at least three transistors and at least one capacitor.

Each of the driving transistor 250 and the switching transistor 255 may have a top gate structure. In another implementation, each of the driving transistor 250 and the switching transistor 255 may have a bottom gate structure or a double gate structure.

The driving transistor 250 may control a driving current according to a data signal, and the sub-pixel structure 200 may emit light according to the driving current. A large amount of current may flow in the first active layer 130 of the driving transistor 250, relative to current flow in the second active layer 135 of the switching transistor 255, and thus the driving transistor 250 may generate a relatively larger amount of heat than the switching transistor 255. For example, when a first portion of the OLED device 100 is driven at a high luminance, heat may be generated in the driving transistors 250 in the first portion. Transistors that are in a second portion adjacent to the first portion may be deteriorated by excessive heat. The second portion may be a portion where an image is not displayed or where it is driven at a low luminance. As heat generated from the driving transistor 250 in the first portion may be transmitted to the transistors in the second portion through the insulating layer structure 300, in an example embodiment the insulating layer structure 300 includes the trench 305 surrounding the driving transistor 250. Thus, the heat generated from the driving transistor 250 may not be transmitted through the insulating layer structure 300 to the transistors in the second portion.

The planarization layer 270 may be on the insulating interlayer 190, the first and second source electrodes 210 and 215, and the first and second drain electrodes 230 and 235, and a contact hole exposing a portion of the second drain electrode 235 of the switching transistor 255 may be formed in the planarization layer 270. In an example embodiment, the planarization layer 270 may fill the trench 305, and may be in contact with a portion of the upper surface of the substrate 110 that is exposed by the trench 305.

In an example embodiment, a thermal conductivity of the planarization layer 270 may be less than a thermal conductivity of the insulation layer structure 300. For example, the thermal conductivity of the insulating layer structure 300 may be about 1.8 W/mK, and the thermal conductivity of the planarization layer 270 may be about 0.12 W/mK. The planarization layer 270 may have a relatively low thermal conductivity. Thus, the planarization layer 270 may relatively reduce the transmission of heat (from the driving transistor 250) from the first insulation layer pattern 300A into the second insulation layer pattern 300B.

The planarization layer 270 may have a thickness sufficient to cover the first and second source electrodes 210 and 215 and the first and second drain electrodes 230 and 235 on the insulating interlayer 190. The planarization layer 270 may have a substantially flat upper surface, and a planarization process may be further performed on the planarization layer 270 to implement the flat upper surface of the planarization layer 270.

The planarization layer 270 may include organic materials or inorganic materials. In an example embodiment, the planarization layer 270 may include organic materials such as polyimide, epoxy-based resin, acryl-based resin, polyester, photoresist, polyacryl-based resin, polyimide-based resin, a polyamide-based resin, a siloxane-based resin, etc.

The lower electrode 290 of the sub-pixel structure 200 may be on the planarization layer 270. The lower electrode 290 may be in direct contact with the second drain electrode 235 via the contact hole of the planarization layer 270, and may be electrically connected to the switching transistor 255. The lower electrode 290 may include a metal, a metal alloy, metal nitride, conductive metal oxide, transparent conductive materials, etc. These may be used alone or in a suitable combination thereof. In another implementation, the lower electrode 290 may have a multi-layered structure including a plurality of layers.

The pixel defining layer 310 may be on a portion of the lower electrode 290 and the planarization layer 270. The pixel defining layer 310 may cover both lateral portions of the lower electrode 290, and may have an opening exposing a portion of an upper surface of the lower electrode 290. The pixel defining layer 310 may include organic materials or inorganic materials. In an example embodiment, the pixel defining layer 310 may include organic materials.

The light emitting layer 330 may be on the lower electrode 290 exposed by the pixel defining layer 310. The light emitting layer 330 may be formed using at least one of light emitting materials capable of generating different colors of light (e.g., a red color of light, a blue color of light, and a green color of light, etc.) according to sub-pixels, e.g., an organic material such as a fluorescent or phosphorescent material. In another implementation, the light emitting layer 330 may generally generate a white color of light by stacking a plurality of light emitting materials capable of generating different colors of light such as a red color of light, a green color of light, a blue color of light, etc. In this case, a color filter may be on the light emitting layer 330 (e.g., to overlap the light emitting layer 330 on an upper surface of the TFE structure 450). The color filter may include at least one selected from a red color filter, a green color filter, and a blue color filter. In another implementation, the color filter may include a yellow color filter, a cyan color filter, and a magenta color filter. The color filter may include a photosensitive resin, etc.

The upper electrode 340 may be on the pixel defining layer 310 and the light emitting layer 330. The upper electrode 340 may cover the light emitting layer 330 and the pixel defining layer 310, and may be on the entire substrate 110. The upper electrode 340 may include a metal, a metal alloy, metal nitride, conductive metal oxide, transparent conductive materials, etc. These may be used alone or in a suitable combination thereof. In another implementation, the upper electrode 340 may have a multi-layered structure including a plurality of layers. Accordingly, the sub-pixel structure 200 including the lower electrode 290, the light emitting layer 330, and the upper electrode 340 may be constituted.

The first TFE layer (thin film encapsulation layer) 451 may be on the upper electrode 340. The first TFE layer 451 may cover the upper electrode 340, and may be as a substantially uniform thickness along a profile of the upper electrode 340. The first TFE layer 451 may prevent the sub-pixel structure 200 from being deteriorated by the permeation of moisture, water, oxygen, etc. In addition, the first TFE layer 451 may protect the sub-pixel structure 200 from external impacts. The first TFE layer 451 may include inorganic materials having flexibility.

The second TFE layer 452 may be on the first TFE layer 451. The second TFE layer 452 may improve the flatness of the OLED device 100, and may protect the sub-pixel structure 200. The second TFE layer 452 may include organic materials having flexibility.

The third TFE layer 453 may be on the second TFE layer 452. The third TFE layer 453 may cover the second TFE layer 452, and may be as a substantially uniform thickness along a profile of the second TFE layer 452. The third TFE layer 453 together with the first TFE layer 451 and the second TFE layer 452 may prevent the sub-pixel structure 200 from being deteriorated by the permeation of moisture, water, oxygen, etc. In addition, the third TFE layer 453 together with the first TFE layer 451 and the second TFE layer 452 may protect the sub-pixel structure 200 from external impacts. The third TFE layer 453 may include inorganic materials having flexibility. Accordingly, the TFE structure 450 including the first TFE layer 451, the second TFE layer 452, and the third TFE layer 453 may be constituted. In another implementation, the TFE structure 450 may have five layers structure where first through fifth TFE layers are stacked or seven layers structure where the first through seventh TFE layers are stacked.

In some example embodiments, an encapsulation substrate that substitutes for the TFE structure 450 may be on the upper electrode 340. The encapsulation substrate may include a quartz substrate, a synthetic quartz substrate, a calcium fluoride substrate, a fluoride-doped quartz substrate, a soda lime glass substrate, a non-alkali glass substrate, etc.

The OLED device 100 in accordance with the present example embodiment includes the trench 305 that surrounds the driving transistor 250, and includes the planarization layer 270 that fills the trench 305, and which may have a relatively low thermal conductivity. Thus, the OLED device 100 may relatively reduce transmission of heat (generated from the driving transistor 250) from the first insulation layer pattern 300A into the second insulation layer pattern 300B. Accordingly, the OLED device 100 may help reduce or prevent deterioration of transistors in the adjacent sub-pixel regions due to heat from the driving transistor 250.

FIGS. 4 through 9 illustrate cross-sectional views of stages in a method of manufacturing an OLED device in accordance with an example embodiment.

Figure 4:
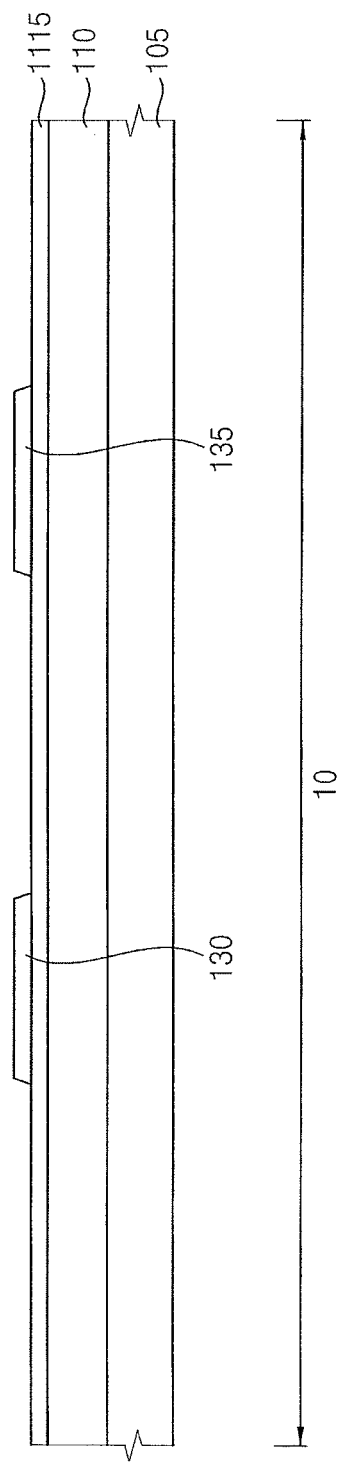
FIGS. 4 through 9 illustrate cross-sectional views of stages in a method of manufacturing an OLED device in accordance with an example embodiment.

Referring to FIG. 4, a rigid glass substrate 105 may be provided. A substrate 110 including transparent materials or opaque materials may be formed on the rigid glass substrate 105. The substrate 110 may be formed using a flexible transparent material such as a flexible transparent resin substrate. In an example embodiment, the substrate 110 may have a structure in which a first organic layer, a first barrier layer, a second organic layer, a second barrier layer are sequentially stacked. The first barrier layer and the second barrier layer each may be formed using inorganic materials such as silicon oxide, etc. In addition, the first organic layer and the second organic layer each may be formed using organic materials such as a polyamide-based resin. In an example embodiment, each of the first and second barrier layers may block moisture or water that may permeate through the first and second organic layers.

In another implementation, the substrate 110 may be formed using a quartz substrate, a synthetic quartz substrate, a calcium fluoride substrate, a fluoride-doped quartz substrate, a soda lime glass substrate, a non-alkali glass substrate etc.

A preliminary buffer layer 1115 may be formed on the entire substrate 110. In an example embodiment, the preliminary buffer layer 1115 may prevent the diffusion of metal atoms and/or impurities from the substrate 110. In addition, the preliminary buffer layer 1115 may control a rate of a heat transfer in a crystallization process for forming active layers, thereby obtaining substantially uniform active layers. Further, the preliminary buffer layer 1115 may improve a surface flatness of the substrate 110 when a surface of the substrate 110 is relatively irregular. According to a type of the substrate 110, at least two preliminary buffer layers may be provided on the substrate 110, or the preliminary buffer layer may not be formed. For example, the preliminary buffer layer 1115 may be formed using organic materials or inorganic materials.

A first active layer 130 and a second active layer 135 may be formed on the preliminary buffer layer 1115. The first active layer 130 and the second active layer 135 may be formed spaced apart from each other laterally (e.g., in a left-right direction in the view shown in FIG. 4). Each of the first and second active layers 130 and 135 may be formed using an oxide semiconductor, an inorganic semiconductor, an organic semiconductor, etc. For example, after a preliminary active layer is formed on the preliminary buffer layer 1115, the first active layer 130 and the second active layer 135 may be formed by selectively etching the preliminary active layer. Thus, the first active layer 130 and the second active layer 135 may be simultaneously (or concurrently) formed using same materials.

Figure 5:
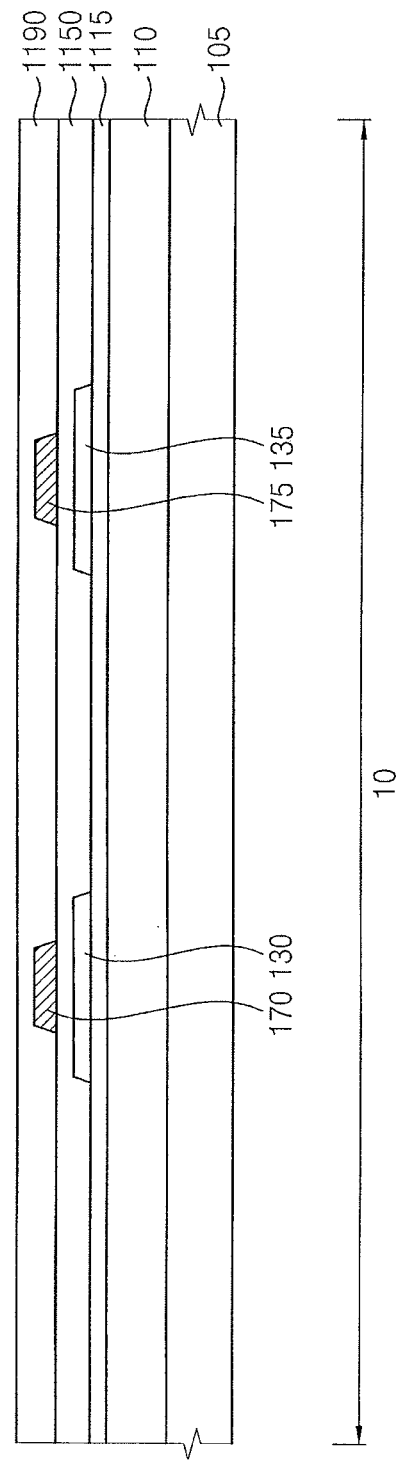

Referring to FIG. 5, a preliminary gate insulation layer 1150 may be formed on the first and second active layers 130 and 135 and the preliminary buffer layer 1115. The preliminary gate insulation layer 1150 may cover the first and second active layers 130 and 135 on the preliminary buffer layer 1115, and may be formed on the entire preliminary buffer layer 1115. For example, the preliminary gate insulation layer 150 may cover the first and second active layers 130 and 135 on the preliminary buffer layer 1115, and may have a substantially flat upper surface without a step around the first and second active layers 130 and 135. In another implementation, the preliminary gate insulation layer 1150 may cover the first and second active layers 130 and 135 on the preliminary buffer layer 1115, and may be formed as a substantially uniform thickness along a profile of the first and second active layers 130 and 135. The preliminary gate insulation layer 1150 may be formed using silicon compound, metal oxide, etc. For example, the preliminary gate insulation layer 1150 may include SiOx, SiNx, SiOxNy, SiOxCy, SiCxNy, AlOx, AlNx, TaOx, HfOx, ZrOx, TiOx, etc.

A first gate electrode 170 and a second gate electrode 175 may be formed on the preliminary gate insulation layer 1150, and may be spaced apart from each other in the lateral direction. The first gate electrode 170 may be formed on a portion of the preliminary gate insulation layer 1150 under which the first active layer 130 is located, and the second gate electrode 175 may be formed on a portion of the preliminary gate insulation layer 1150 under which the second active layer 135 is located. Each of the first and second gate electrodes 170 and 175 may be formed using a metal, a metal alloy, metal nitride, conductive metal oxide, transparent conductive materials, etc. For example, each of the first and second gate electrodes 170 and 175 may include Au, Ag, Al, W, Cu, Pt, Ni, Ti, Pd, Mg, Ca, Li, Cr, Ta, Mo, Sc, Nd, Ir, an alloy of aluminum, AlNx, an alloy of silver, WNx, an alloy of copper, an alloy of molybdenum, TiNx, CrNx, TaNx, SRO, ZnOx, ITO, SnOx, InOx, GaOx, IZO, etc. These may be used alone or in a suitable combination thereof. For example, after a preliminary gate electrode layer is formed on the entire preliminary gate insulation layer 1150, the first and second gate electrodes 170 and 175 may be formed by selectively etching the preliminary gate electrode layer. Thus, the first and second gate electrodes 170 and 175 may be simultaneously formed using same materials. In another implementation, each of the first and second gate electrodes 170 and 175 may have a multi-layered structure including a plurality of layers.

A preliminary insulating interlayer 1190 may be formed on the first and second gate electrodes 170 and 175 and the preliminary gate insulation layer 1150. The preliminary insulating interlayer 1190 may cover the first and second gate electrodes 170 and 175 on the preliminary gate insulation layer 1150, and may be formed on the entire preliminary gate insulation layer 1150. For example, the preliminary insulating interlayer 1190 may cover the first and second gate electrodes 170 and 175 on the preliminary gate insulation layer 1150, and may have a substantially flat upper surface without a step around the first and second gate electrodes 170 and 175. In another implementation, the preliminary insulating interlayer 1190 may cover the first and second gate electrodes 170 and 175 on the preliminary gate insulation layer 1150, and may be formed as a substantially uniform thickness along a profile of the first and second gate electrodes 170 and 175. The preliminary insulating interlayer 1190 may be formed using silicon compound, metal oxide, etc.

Figure 6:
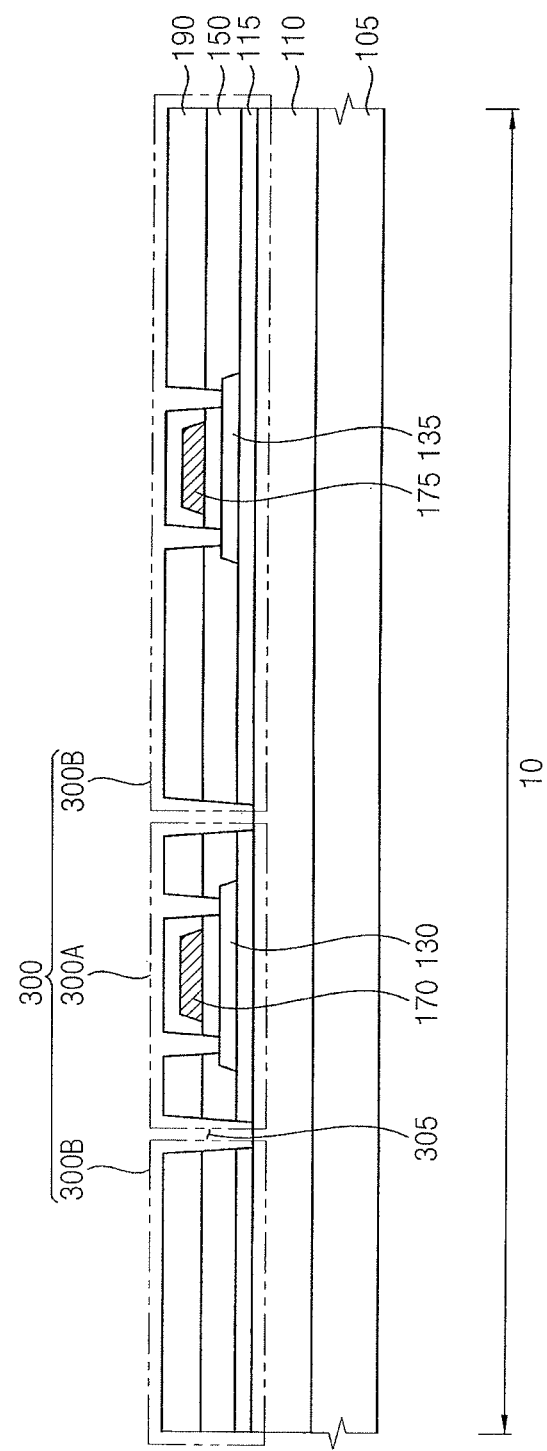

Referring to FIG. 6, a buffer layer 115, a gate insulation layer 150, and an insulating interlayer 190 that have first, second, and third openings and first, second, third, and fourth contact holes may be formed by partially etching the preliminary buffer layer 1115, the preliminary gate insulation layer 1150, and the preliminary insulating interlayer 1190.

The first opening may be formed in the buffer layer 115 and may expose a portion of an upper surface of the substrate 110. In addition, the second opening may be formed in the insulating interlayer 190 such that the first active layer 130 is surrounded, and may overlap the first opening. Further, the third opening may be formed in the insulating interlayer 190 such that the first gate electrode 170 is surrounded, may overlap the first and second openings. Meanwhile, the first contact hole may be formed by removing a first portion of the gate insulation layer 150 and the insulating interlayer 190, and may expose a source region of the first active layer 130. In addition, the second contact hole may be formed by removing a second portion of the gate insulation layer 150 and the insulating interlayer 190, and may expose a drain region of the first active layer 130. Further, each of the third and fourth contact holes may be formed by removing each of third and fourth portions of the gate insulation layer 150 and the insulating interlayer 190, and may expose each of source and drain regions of the second active layer 135.

In an example embodiment, the buffer layer 115, the gate insulation layer 150, and the insulating interlayer 190 may be denoted as the insulating layer structure 300, and the first through third openings may correspond to the trench 305. In addition, a portion surrounded by the trench 305 of the insulating layer structure 300 may be denoted as a first insulation layer pattern 300A, and a portion outside the trench 305 of the insulating layer structure 300 may be denoted as a second insulation layer pattern 300B. For example, the first insulation layer pattern 300A may be spaced apart from the second insulation layer pattern 300B, and may have a shape of an island. In an example embodiment, the trench 305 may expose a portion of an upper surface of the substrate 110.

Figure 7:
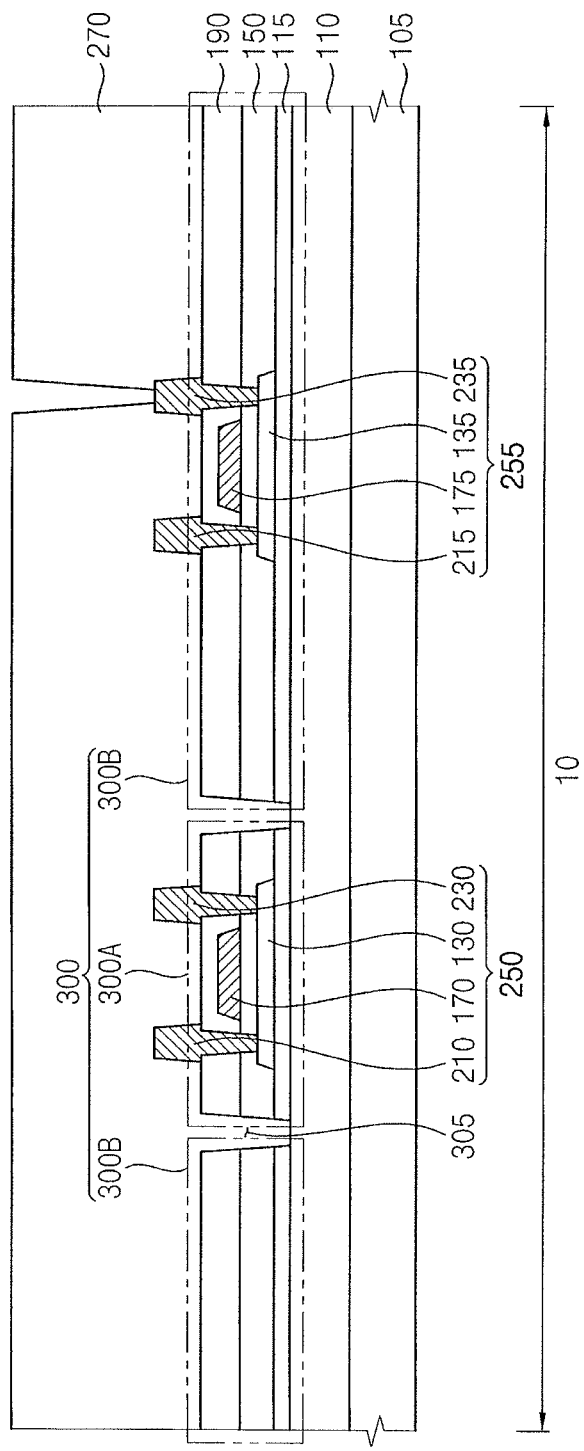

Referring to FIG. 7, a first source electrode 210, a first drain electrode 230, the second source electrode 215, and the second drain electrode 235 may be formed on the insulating interlayer 190. In an example embodiment, the first source electrode 210 and the first drain electrode 230 may be inside or surrounded by the trench 305, and the second source electrode 215 and the second drain electrode 235 may be outside the trench 305. The first source electrode 210 may be in contact with the source region of the first active layer 130 via the first contact hole, and the first drain electrode 230 may be in contact with the drain region of the first active layer 130 via the second contact hole. In addition, the second source electrode 215 may be in contact with the source region of the second active layer 135 via the third contact hole, and the second drain electrode 235 may be in contact with the drain region of the second active layer 135 via the fourth contact hole. Each of the first and second source electrodes 210 and 215 and the first and second drain electrodes 230 and 235 may be formed using a metal, an alloy, metal nitride, conductive metal oxide, transparent conductive materials, etc. These may be used alone or in a suitable combination thereof. In another implementation, each of the first and second source electrodes 210 and 215 and the first and second drain electrodes 230 and 235 may have a multi-layered structure including a plurality of layers. Accordingly, a driving transistor 250 including the first active layer 130, the first gate electrode 170, the first source electrode 210, and the first drain electrode 230 may be formed, and a switching transistor 255 including the second active layer 135, the second gate electrode 175, the second source electrode 215, and the second drain electrode 235 may be formed.

A planarization layer 270 may be formed on the insulating interlayer 190, the first and second source electrodes 210 and 215, and the first and second drain electrodes 230 and 235, and a contact hole exposing a portion of the second drain electrode 235 of the switching transistor 255 may be formed in the planarization layer 270. In an example embodiment, the planarization layer 270 may fill the trench 305, and may be in contact with a portion of an upper surface of the substrate 110 exposed at the bottom of the trench 305. In addition, a thermal conductivity of the planarization layer 270 may be less than a thermal conductivity of the insulation layer structure 300. The planarization layer 270 may be formed to cover the first and second source electrodes 210 and 215 and the first and second drain electrodes 230 and 235 on the insulating interlayer 190. In this case, the planarization layer 270 may have a substantially flat upper surface, and a planarization process may be further performed on the planarization layer 270 to implement the flat upper surface of the planarization layer 270. The planarization layer 270 may include organic materials or inorganic materials. In an example embodiment, the planarization layer 270 may be formed using organic materials such as polyimide, epoxy-based resin, acryl-based resin, polyester, photoresist, polyacryl-based resin, polyimide-based resin, a polyamide-based resin, a siloxane-based resin, etc.

Figure 8:
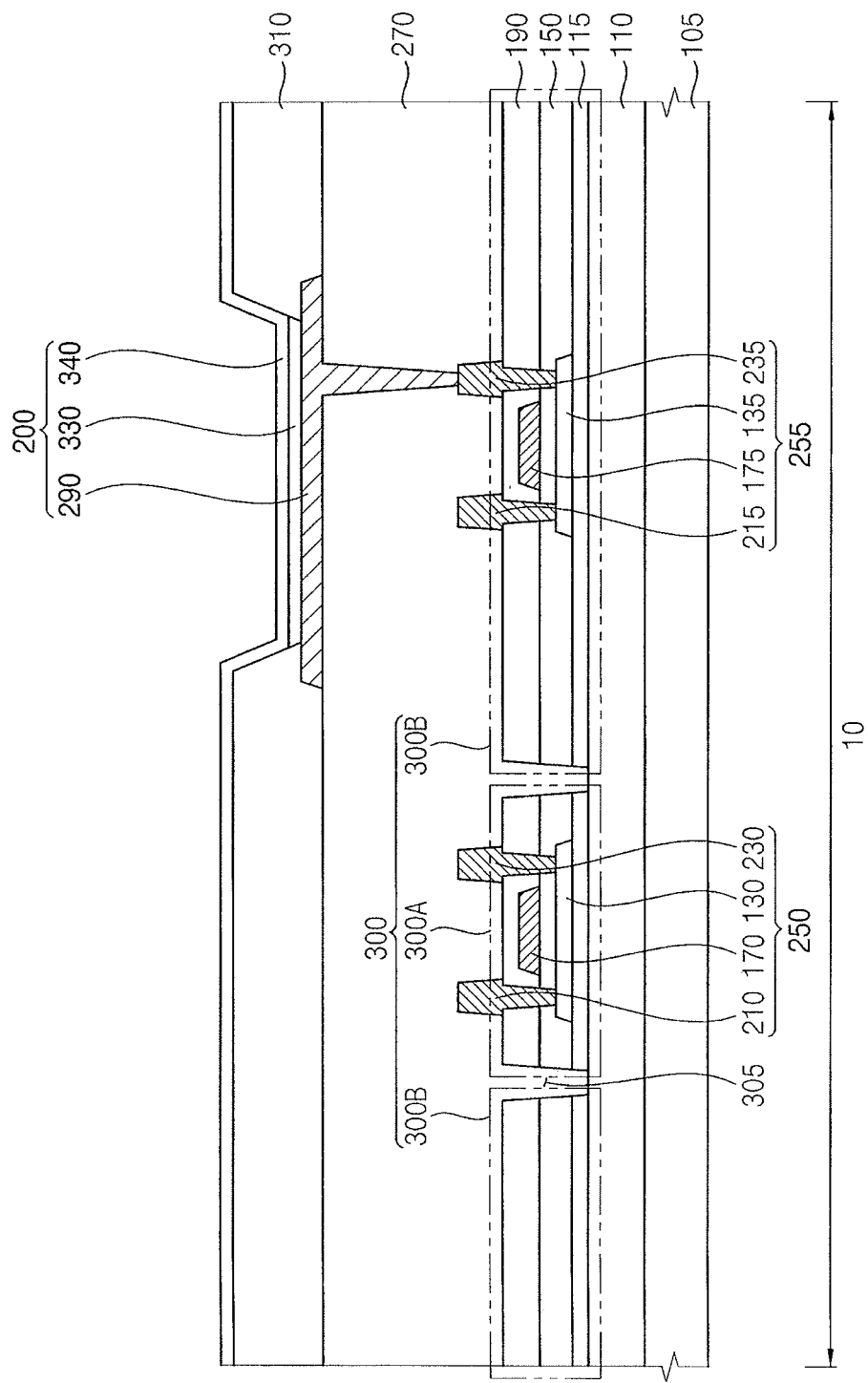

Referring to FIG. 8, a lower electrode 290 may be formed on the planarization layer 270. The lower electrode 290 may be in direct contact with the drain electrode 230 via the contact hole of the planarization layer 270, and may be electrically connected to the driving transistor 250. The lower electrode 290 may be formed using a metal, a metal alloy, metal nitride, conductive metal oxide, transparent conductive materials, etc. These may be used alone or in a suitable combination thereof. In another implementation, the lower electrode 290 may have a multi-layered structure including a plurality of layers.

A pixel defining layer 310 may be formed on a portion of the lower electrode 290 and the planarization layer 270. The pixel defining layer 310 may cover both lateral portions of the lower electrode 290, and may have an opening exposing a portion of an upper surface of the lower electrode 290. The pixel defining layer 310 may include organic materials or inorganic materials. In an example embodiment, the pixel defining layer 310 may be formed using organic materials.

A light emitting layer 330 may be formed on the lower electrode 290 exposed by the pixel defining layer 310. The light emitting layer 330 may be formed using at least one of light emitting materials capable of generating different colors of light (e.g., a red color of light, a blue color of light, and a green color of light, etc.) according to sub-pixels. In another implementation, the light emitting layer 330 may generally generate a white color of light by stacking a plurality of light emitting materials capable of generating different colors of light such as a red color of light, a green color of light, a blue color of light, etc. In this case, a color filter may be formed on the light emitting layer 330. The color filter may include at least one selected from a red color filter, a green color filter, and a blue color filter. In another implementation, the color filter may include a yellow color filter, a cyan color filter, and a magenta color filter. The color filter may be formed using a photosensitive resin, etc.

An upper electrode 340 may be formed on the pixel defining layer 310 and the light emitting layer 330. The upper electrode 340 may cover the light emitting layer 330 and the pixel defining layer 310, and may be formed on the entire substrate 110. The upper electrode 340 may be formed using a metal, a metal alloy, metal nitride, conductive metal oxide, transparent conductive materials, etc. These may be used alone or in a suitable combination thereof. In another implementation, the upper electrode 340 may have a multi-layered structure including a plurality of layers. Accordingly, a sub-pixel structure 200 including the lower electrode 290, the light emitting layer 330, and the upper electrode 340 may be formed.

Figure 9:
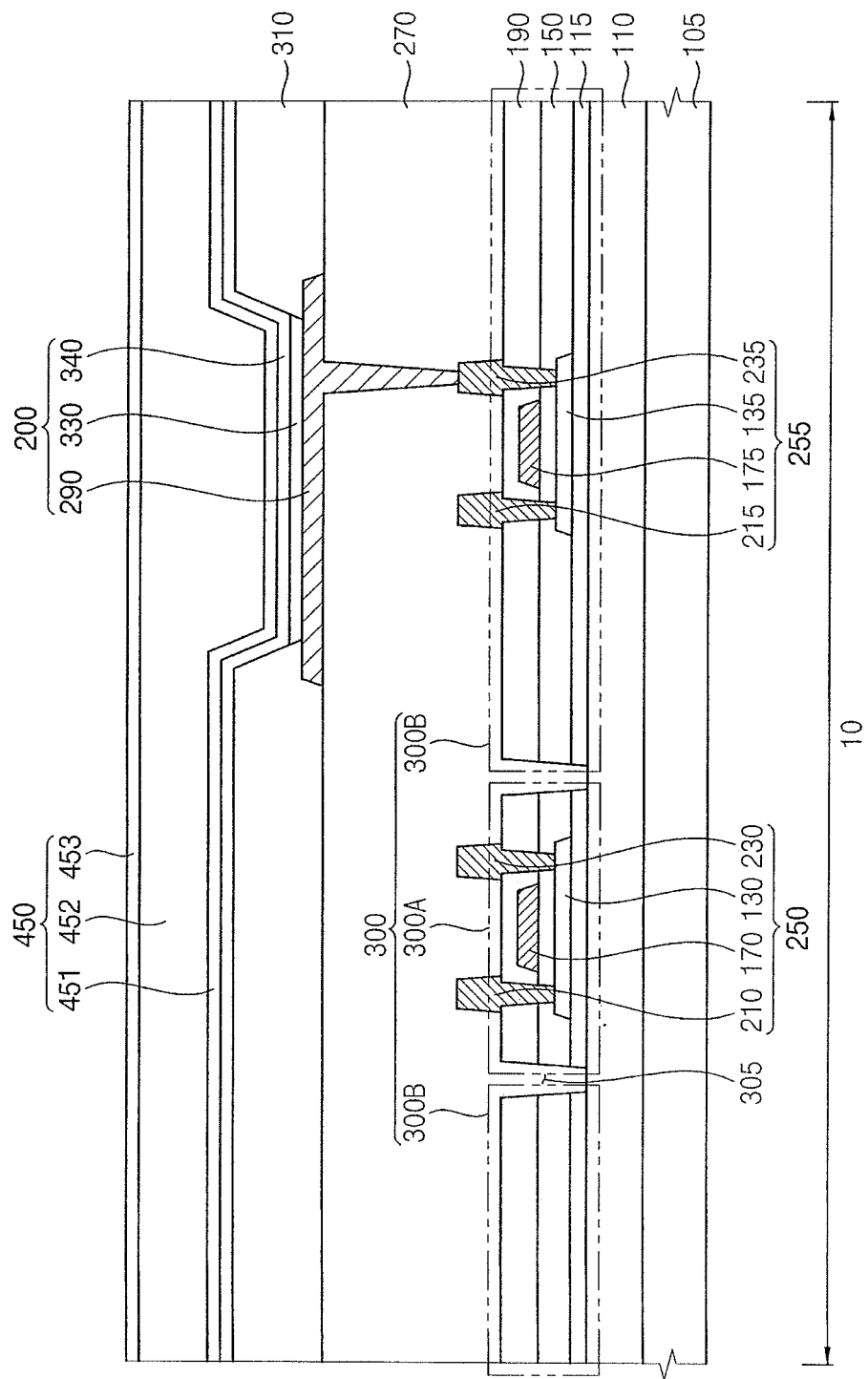

Referring to FIG. 9, a first TFE layer 451 may be formed on the upper electrode 340. The first TFE layer 451 may cover the upper electrode 340, and may be formed as a substantially uniform thickness along a profile of the upper electrode 340. The first TFE layer 451 may prevent the sub-pixel structure 200 from being deteriorated by the permeation of moisture, water, oxygen, etc. In addition, the first TFE layer 451 may protect the sub-pixel structure 200 from external impacts. The first TFE layer 451 may be formed using inorganic materials having flexibility.

A second TFE layer 452 may be formed on the first TFE layer 451. The second TFE layer 452 may improve the flatness of the OLED device 100, and may protect the sub-pixel structure 200. The second TFE layer 452 may be formed using organic materials having flexibility.

A third TFE layer 453 may be formed on the second TFE layer 452. The third TFE layer 453 may cover the second TFE layer 452, and may be formed as a substantially uniform thickness along a profile of the second TFE layer 452. The third TFE layer 453 together with the first TFE layer 451 and the second TFE layer 452 may prevent the sub-pixel structure 200 from being deteriorated by the permeation of moisture, water, oxygen, etc. In addition, the third TFE layer 453 together with the first TFE layer 451 and the second TFE layer 452 may protect the sub-pixel structure 200 from external impacts. The third TFE layer 453 may be formed using inorganic materials having flexibility. Accordingly, a TFE structure 450 including the first TFE layer 451, the second TFE layer 452, and the third TFE layer 453 may be formed. In another implementation, the TFE structure 450 may have five layers structure where first through fifth TFE layers are stacked or seven layers structure where the first through seventh TFE layers are stacked.

After the TFE structure 450 is formed, the rigid glass substrate 105 may be removed from the substrate 110. Accordingly, an OLED device 100 illustrated in FIG. 1 may be manufactured.

Figure 10:
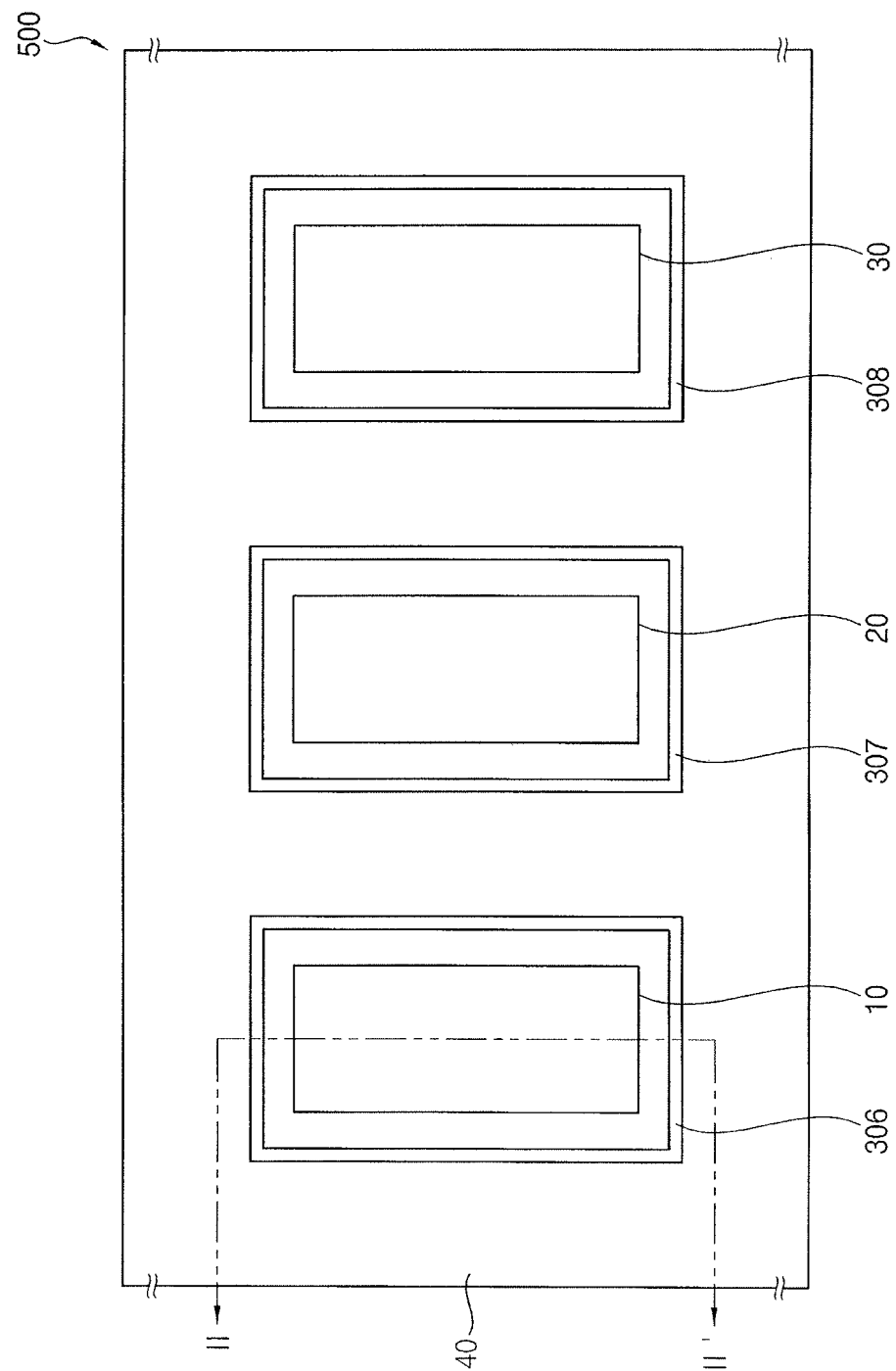
FIG. 10 illustrates a plan view of an OLED device in accordance with an example embodiment.

FIG. 10 is a plan view illustrating an OLED device in accordance with an example embodiment.

An OLED device 500 illustrated in FIG. 10 may have a configuration substantially the same as or similar to that of the OLED device 100 described with reference to FIGS. 1 and 2 except for first outer trenches 306, 307, and 308. In FIG. 10, detailed descriptions for elements that are substantially the same as or similar to elements described with reference to FIGS. 1 and 2 may not be repeated.

Referring to FIGS. 1, 2 and 10, the OLED device 500 may have the display region 50 including the plurality of pixel regions 40 and the plurality of sub-pixel regions 10, 20, and 30. The pixel regions 40 may be entirely arranged in a first direction that is in parallel to an upper surface of the OLED device 500 and a second direction that is perpendicular to the first direction in the display region 50. In addition, each of the pixel regions 40 may include the sub-pixel regions 10, 20, and 30, and three sub-pixel regions may be defined as one pixel region.

Sub-pixel structures (e.g., a sub-pixel structure 200 of FIG. 11) may be in the sub-pixel regions 10, 20, and 30, respectively. For example, the sub-pixel structure in the sub-pixel region 10 may emit a red color of light, and the sub-pixel structure in the sub-pixel region 20 may emit a green color of light. The sub-pixel structure in the sub-pixel region 30 may emit a blue color of light. Meanwhile, wirings may be in a remaining portion of the display region 50 except for the sub-pixel regions 10, 20, and 30. For example, the wirings may include data signal wirings, scan signal wirings, light emission signal wirings, initialization signal wirings, power supply voltage wirings, etc.

In addition, at least one driving transistor 250 and at least one switching transistor 255 may be in each of the sub-pixel regions 10, 20, and 30. In an example embodiment, the trench 305 surrounding the driving transistor 250 may be formed in each of the sub-pixel regions 10, 20, and 30 (refer to FIG. 2). Additionally, as shown in FIG. 10, respective first outer trenches 306, 307, and 308 may be formed along a boundaries of the sub-pixel regions 10, 20, and 30, respectively. For example, as illustrated in FIG. 10, the first outer trench 306 may be formed along an outer profile of the sub-pixel region 10, and the first outer trench 307 may be formed along an outer profile of the sub-pixel region 20. The first outer trench 307 may be formed along an outer profile of the sub-pixel region 30. The first outer trenches 306, 307, and 308 may not be overlapped to each other, may be spaced apart from each other.

Figure 11:
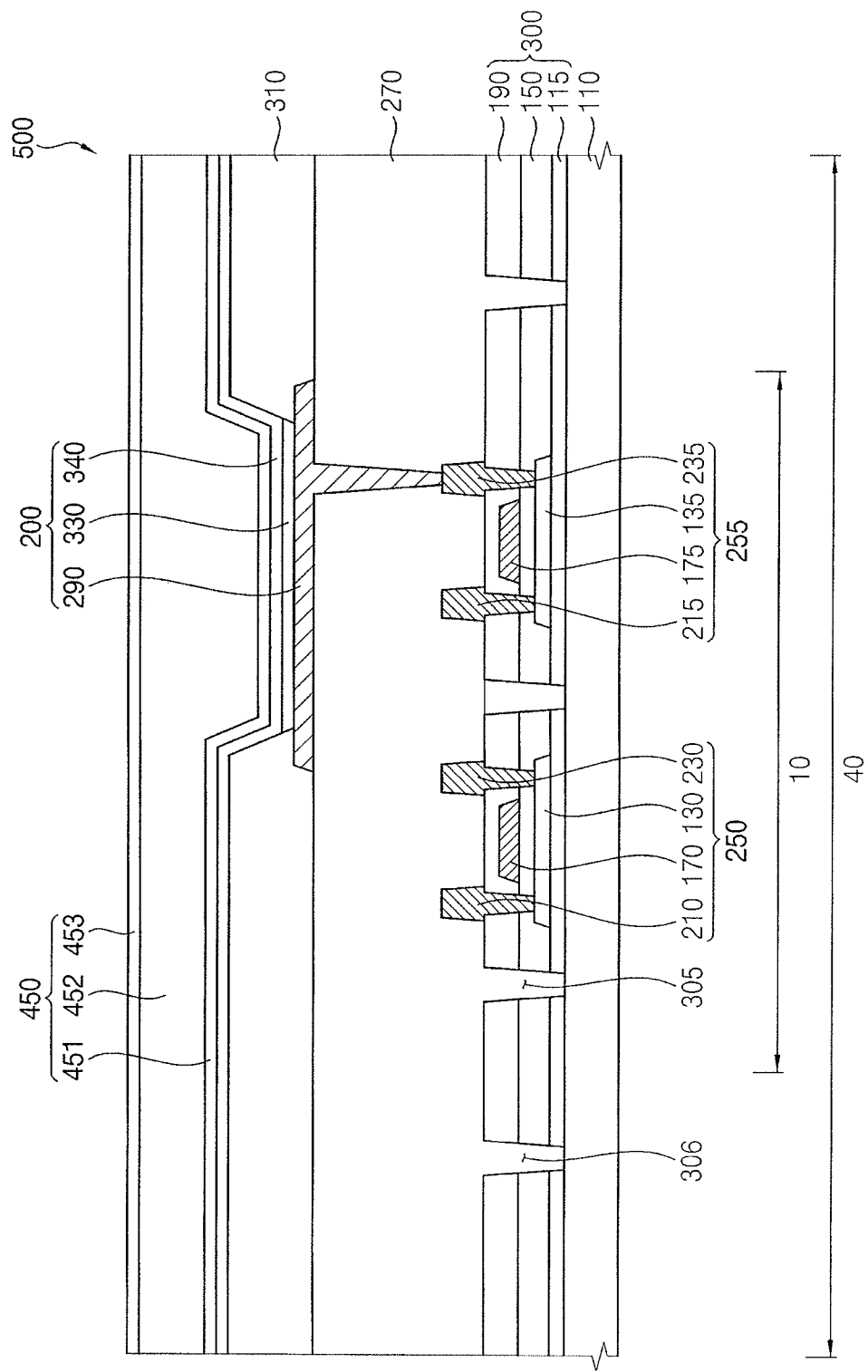
FIG. 11 illustrates a cross-sectional view taken along a line II-IF of FIG. 10.

FIG. 11 is a cross-sectional view taken along a line I-I' of FIG. 10.

Referring to FIG. 11, the OLED device 500 may include the substrate 110, the buffer layer 115, the gate insulation layer 150, an insulating interlayer 190, the driving transistor 250, the switching transistor 255, the trench 305, the first outer trench 306, the planarization layer 270, the pixel defining layer 310, the sub-pixel structure 200, the TFE structure 450, etc. The driving transistor 250 may include the first active layer 130, the first gate electrode 170, the first source electrode 210, and the first drain electrode 230, and the switching transistor 255 may include the second active layer 135, the second gate electrode 175, the second source electrode 215, and the second drain electrode 235. In addition, the sub-pixel structure 200 may include the lower electrode 290, the light emitting layer 330, and the upper electrode 340, and the TFE structure 450 may include the first TFE layer 451, the second TFE layer 452, and the third TFE layer 453. Further, the buffer layer 115, the gate insulation layer 150, and the insulating interlayer 190 may define the insulating layer structure 300, and the insulating layer structure 300 may have the trench 305 and the first outer trench 306.

The first outer trench 306 of the insulating layer structure 300 may be formed along a boundary of the sub-pixel region 10. In an example embodiment, the first outer trench 306 may expose a portion of an upper surface of the substrate 110. Thus, all of inorganic insulation layers may be removed in a portion where the first outer trench 306 is formed. In another implementation, the first outer trench 306 may be formed by removing at least a portion of the insulating layer structure 300 such that the first outer trench 306 surrounds the sub-pixel region 10. In this case, the first outer trench 306 may not expose the upper surface of the substrate 110.

The planarization layer 270 may be on the insulating interlayer 190, the first and second source electrodes 210 and 215, and the first and second drain electrodes 230 and 235, and the contact hole exposing a portion of the second drain electrode 235 of the switching transistor 255 may be formed in the planarization layer 270. In an example embodiment, the planarization layer 270 may fill the trench 305 and the first outer trench 306, and may be in contact with an upper surface of the substrate 110. In addition, a thermal conductivity of the planarization layer 270 may be less than a thermal conductivity of the insulation layer structure 300. The planarization layer 270 may have a relatively low thermal conductivity. Thus, the planarization layer 270 may relatively reduce the transmission of heat (generated from the driving transistor 250) to transistors in adjacent sub-pixel regions.

The OLED device 500 in accordance with the present example embodiment includes the trench 305 that surrounds the driving transistor 250, the first outer trench 306 of the insulating layer structure 300 along a boundary of the sub-pixel region 10, and includes the planarization layer 270 that fills the trench 305 and the first outer trench 306, and which may have a relatively low thermal conductivity. Thus, the OLED device 500 may relatively reduce the transmission of heat (generated from the driving transistor 250) to the adjacent sub-pixel regions. Accordingly, the OLED device 500 may prevent transistors in the adjacent sub-pixel regions from being deteriorated by the heat generated from the driving transistor 250.

Figure 12:
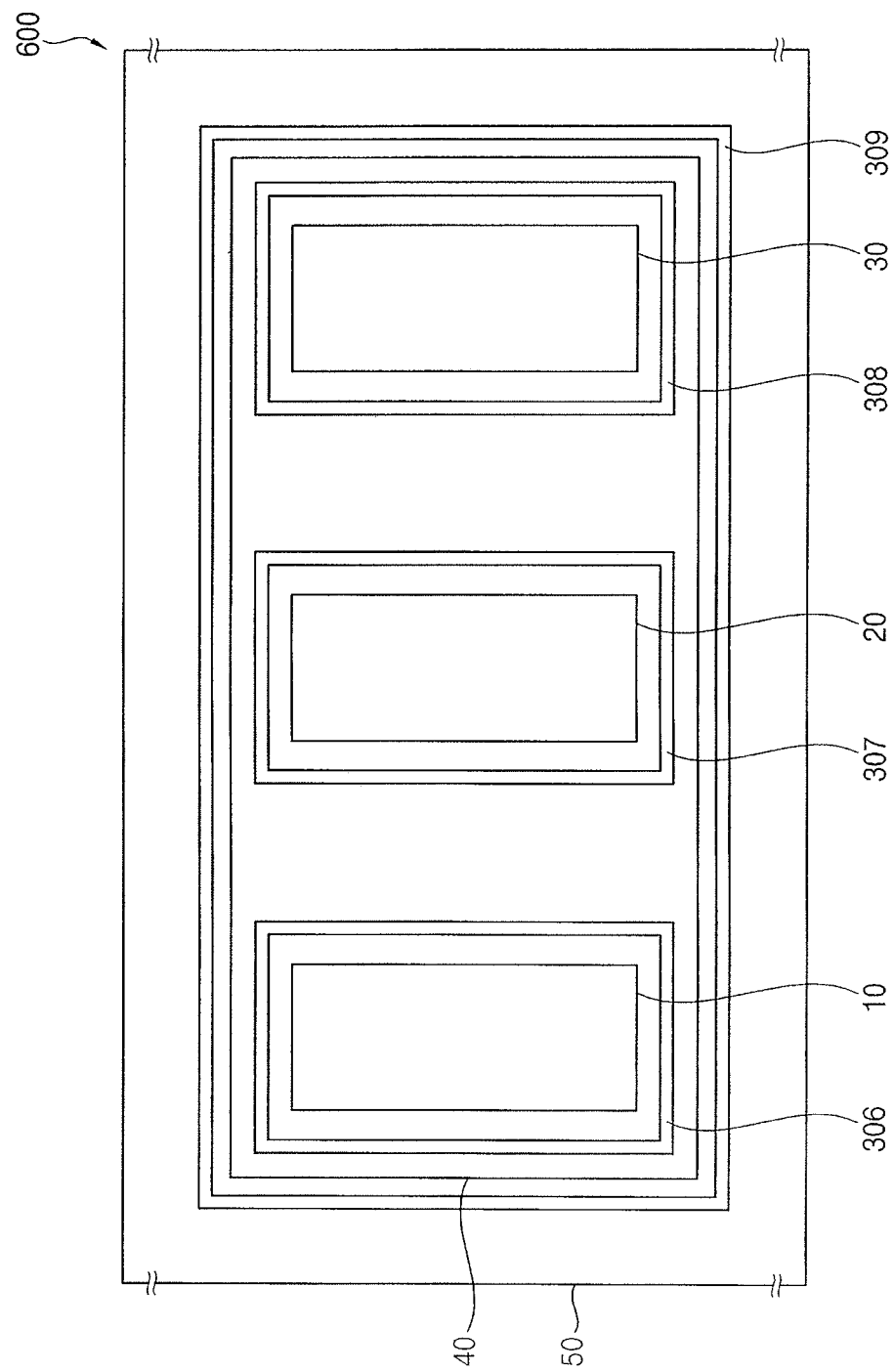
FIG. 12 illustrates a plan view of an OLED device in accordance with an example embodiment.

FIG. 12 is a plan view illustrating an OLED device in accordance with an example embodiment.

An OLED device 600 illustrated in FIG. 12 may have a configuration substantially the same as or similar to that of the OLED device 500 described with reference to FIG. 10 except for a second outer trench 309. In FIG. 12, detailed descriptions for elements that are substantially the same as or similar to elements described with reference to FIG. 10 may not be repeated.

Referring to FIGS. 10 and 12, the OLED device 600 may have the display region 50 including the plurality of pixel regions 40 and the plurality of sub-pixel regions 10, 20, and 30. The pixel regions 40 may be entirely arranged in a first direction that is in parallel to an upper surface of the OLED device 500 and a second direction that is perpendicular to the first direction in the display region 50. In addition, each of the pixel regions 40 may include the sub-pixel regions 10, 20, and 30, and three sub-pixel regions may be defined as one pixel region.

At least one driving transistor 250 and at least one switching transistor 255 may be in each of the sub-pixel regions 10, 20, and 30. In an example embodiment, the trench 305 surrounding the driving transistor 250 may be formed in each of the sub-pixel regions 10, 20, and 30 (refer to FIG. 2), and the first outer trenches 306, 307, and 308 may be formed along a boundary of each of the sub-pixel regions 10, 20, and 30, respectively. In addition, the second outer trench 309 may be formed along a boundary of each of the pixel regions 40. For example, as illustrated in FIG. 12, the second outer trench 309 may be formed along an outer profile of the pixel region 40. The second outer trench 309 along the boundary of each of the pixel regions 40 may not be overlapped to each other, may be spaced apart from each other.

Figure 13:
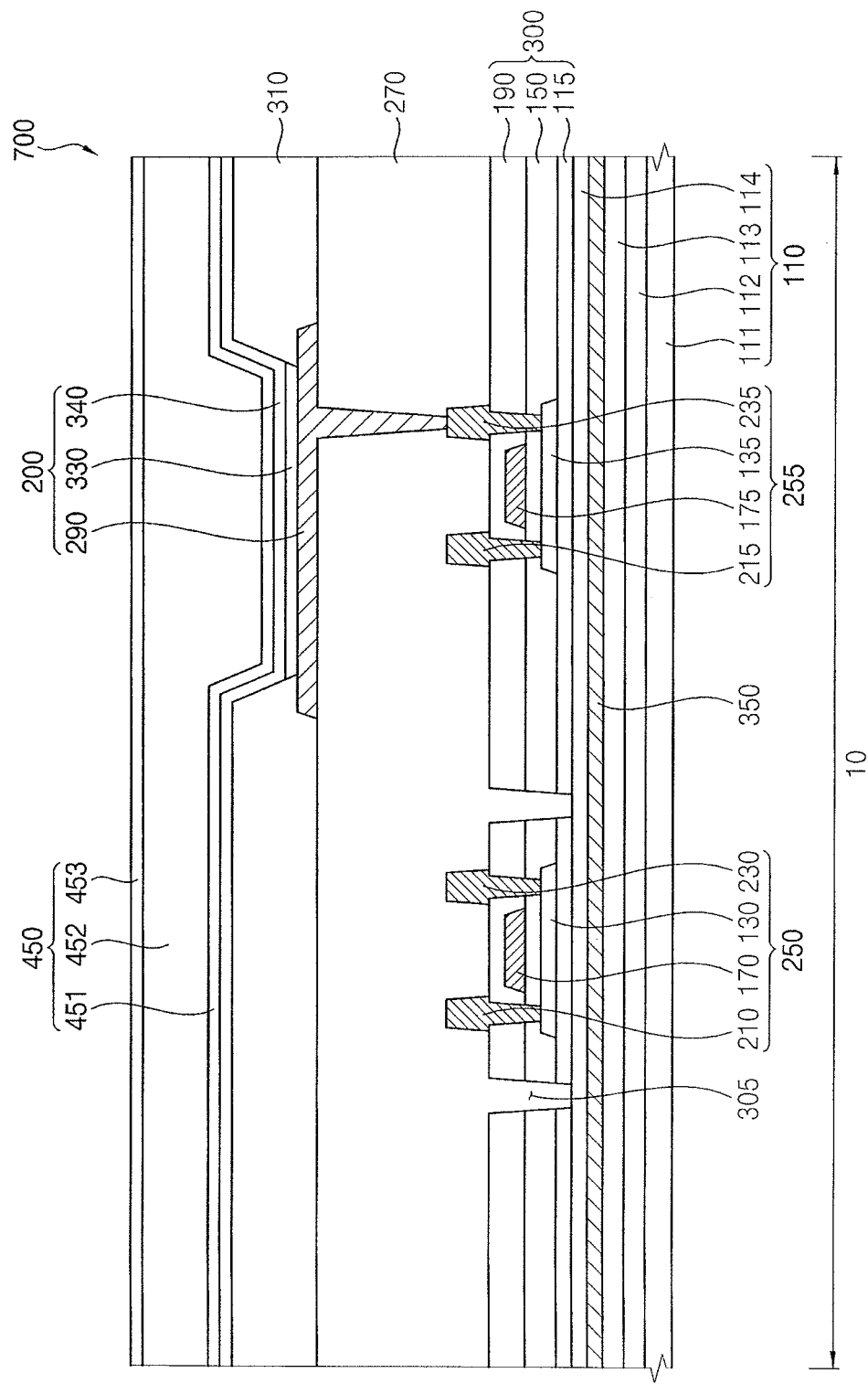
FIG. 13 illustrates a cross-sectional view of an OLED device in accordance with an example embodiment.

FIG. 13 illustrates a cross-sectional view of an OLED device in accordance with an example embodiment.

An OLED device 700 illustrated in FIG. 13 may have a configuration substantially the same as or similar to that of an OLED device 100 described with reference to FIGS. 1, 2 and 3 except for a conductive layer 350. In FIG. 13, detailed descriptions for elements that are substantially the same as or similar to elements described with reference to FIGS. 1, 2 and 3 may not be repeated.

Referring to FIG. 13, an OLED device 700 may include the substrate 110, the conductive layer 350, the buffer layer 115, the gate insulation layer 150, the insulating interlayer 190, the driving transistor 250, the switching transistor 255, the trench 305, the planarization layer 270, the pixel defining layer 310, the sub-pixel structure 200, the TFE structure 450, etc. The substrate 110 may include the first organic layer 111, the first barrier layer 112, the second organic layer 113, and the second barrier layer 114, and the buffer layer 115, the gate insulation layer 150, and the insulating interlayer 190 may define the insulating layer structure 300.

The substrate 110 including transparent or opaque insulation materials may be provided. The substrate 110 may include a flexible transparent resin substrate. In an example embodiment, the substrate 110 may have a configuration where the first organic layer 111, the first barrier layer 112, the second organic layer 113, and the second barrier layer 114 are sequentially stacked. The first barrier layer 112 and the second barrier layer 114 each may include inorganic materials such as silicon oxide, etc. In addition, the first organic layer 111 and the second organic layer 113 each may include organic materials such as a polyamide-based resin such that the OLED device 700 has flexibility. In an example embodiment, each of the first and second barrier layers 112 and 114 may block moisture or water that permeates through the first and second organic layers 111 and 113.

The conductive layer 350 may be on the entire second organic layer 113. The conductive layer 350 may help to disperse heat generated from the driving transistor 250. In an implementation, the conductive layer 350 may be in an equipotential state by providing a voltage to the conductive layer 350, and electric charges in the substrate 110 may be uniformly distributed. In another implementation, the conductive layer 350 may be grounded. In this case, electric charges in the substrate 110 may be discharged to an outside through the conductive layer 350.

For example, when the substrate 110 of the OLED device 700 is formed of a polyimide substrate, the polyimide substrate may develop a relatively larger amount of electric charges than a glass substrate. When the driving transistor 250 and the switching transistor 255 are driven, the electric charges may be non-uniformly distributed under the driving transistor 250 and the switching transistor 255, such that the electric charges may interfere with drive of the driving transistor 250 and the switching transistor 255. Thus, a threshold voltage of the transistors may be changed because of a non-uniform distribution of the electric charges, and a luminance of the sub-pixel structure 200 may be changed because of the changed amount of current. Thus, reliability and lifetime of the transistors may be reduced.

In an example embodiment, the conductive layer 350 may include doped-amorphous silicon. For example, after amorphous silicon is formed on the second organic layer 113, an impurity doping process may be performed, and the doped-amorphous silicon may serve as a metal. When the first active layer 130 and the second active layer 135 are formed as amorphous silicon, the conductive layer 350 may be on the second organic layer 113 without an additional process. In another implementation, the conductive layer 350 may include a metal, an alloy of a metal, metal nitride, conductive metal oxide, transparent conductive materials, etc.

In some example embodiments, the substrate 110 may further include conductive materials so as to disperse heat generated from the driving transistor 250. For example, the substrate 110 may include polymer such as polyvinylidene fluoride (PVDF) and polypyrrole (PPy), metal oxide nano-film, metal oxide nano-particle, positive temperature coefficient (PTC) materials, etc. The substrate 110 may include a conductive layer including the conductive materials, or the conductive materials may be included in one or more of the first organic layer 111, the first barrier layer 112, the second organic layer 113, and the buffer layer 115.

The OLED device 700 in accordance with the present example embodiment includes the conductive layer 350. Thus, heat generated from the driving transistor 250 may be relatively quickly dispersed, and electric charges included in the substrate 110 may be uniformly distributed. Accordingly, the OLED device 700 may prevent deterioration of transistors of adjacent sub-pixel regions by heat generated from the driving transistor 250, and lifetime of the transistors included in the OLED device 700 may be improved.

Embodiments may be applied to various display devices including an organic light emitting display device. For example, the present invention may be applied to vehicle-display device, a ship-display device, an aircraft-display device, portable communication devices, display devices for display or for information transfer, a medical-display device, etc.

By way of summation and review, an OLED device may include a plurality of transistors (e.g., driving transistors and switching transistors), a plurality of capacitors, a plurality of sub-pixel structures, etc., and a flexible OLED device capable of bending or folding a portion of the OLED device including lower and upper substrates having flexible materials may have been developed. When a specific area (or part, portion etc.) of the OLED device is driven at a high luminance, heat may be generated in a driving transistor in the specific area. Further, transistors that are at a portion adjacent to the specific area may be deteriorated by the heat. In addition, when the lower substrate of the OLED device is formed of a polyimide substrate, electric charges may interfere with the driving of the transistors because the polyimide substrate may have a relatively large number of the electric charges than a glass substrate.

As described above, an OLED device in accordance with an example embodiment may include a trench that surrounds a driving transistor, and a planarization layer that fills the trench and has a relatively low thermal conductivity. The OLED device may relatively reduce transfer of heat of the driving transistor from the first insulation layer pattern into the second insulation layer pattern, which may help prevent transistors in the adjacent sub-pixel regions from being deteriorated by the heat generated from the driving transistor.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light emitting display (OLED) device, comprising:
    a substrate having a display region including a plurality of sub-pixel regions;
    a respective driving transistor and a respective switching transistor on the substrate in each of the sub-pixel regions;
    an insulation layer structure on the substrate, the insulation layer structure having a respective trench exposing a portion of an upper surface of the substrate and surrounding the driving transistor in each of the sub-pixel regions; and
    a respective sub-pixel structure on the insulation layer structure in each of the sub-pixel regions.

2. The OLED device as claimed in claim 1, wherein, in the sub-pixel regions, the driving transistor is surrounded by the trench, and the switching transistor is outside the trench.

3. The OLED device as claimed in claim 2, wherein the insulation layer structure includes:
    a first insulation layer pattern surrounded by the trench; and
    a second insulation layer pattern outside the trench, the second insulation layer pattern being spaced apart from the first insulation layer pattern by the trench.

4. The OLED device as claimed in claim 2, wherein the trench extends along an outer profile of the driving transistor.

5. The OLED device as claimed in claim 1, further comprising a planarization layer on the driving and switching transistors and the insulation layer structure, the planarization layer filling the trench and being in contact with the exposed portion of the upper surface of the substrate.

6. The OLED device as claimed in claim 5, wherein a thermal conductivity of the planarization layer is less than a thermal conductivity of the insulation layer structure.

7. The OLED device as claimed in claim 1, wherein the insulation layer structure includes:
    a buffer layer on the substrate, the buffer layer having a respective first opening surrounding each of the driving transistors;
    a gate insulation layer on the buffer layer, the gate insulation layer having a respective second opening overlapping a corresponding first opening and surrounding a corresponding driving transistor; and
    an insulating interlayer on the gate insulation layer, the insulating interlayer having a respective third opening overlapping a corresponding second opening and surrounding the corresponding driving transistor.

8. The OLED device as claimed in claim 7, wherein the first, second, and third openings in one sub-pixel region collectively define the trench in the one sub-pixel region.

9. The OLED device as claimed in claim 1, wherein:
    the plurality of sub-pixel regions includes first through (M)th sub-pixel regions, where M is an integer greater than 1,
    the driving transistors include first through (N)th driving transistors in the first through (M)th sub-pixel regions, respectively, where N is an integer greater than 1, and
    the trenches include first through (L)th trenches surrounding the first through (N)th driving transistors, respectively, where L is an integer greater than 1.

10. The OLED device as claimed in claim 9, wherein:
    a (J)th driving transistor among the first through (N)th driving transistors is in a (K)th sub-pixel region among the first through (M)th sub-pixel regions, where J is an integer between 1 and N, and K is an integer between 1 and M, and
    an (I)th trench among the first through (L)th trenches surrounds the (J)th driving transistor, where I is an integer between 1 and L.

11. The OLED device as claimed in claim 1, wherein the insulation layer structure further includes first outer trenches, a respective first outer trench being along a boundary of each of the sub-pixel regions on the substrate.

12. The OLED device as claimed in claim 11, wherein the first outer trenches do not overlap each other and are spaced apart from each other.

13. The OLED device as claimed in claim 1, wherein:
    the plurality of sub-pixel regions includes first through (M)th sub-pixel regions, where M is an integer greater than 1,
    (K−1)th, (K)th, and (K+1)th sub-pixel regions among the first through (M)th sub-pixel regions are collectively defined as an (H)th pixel region, where K is an integer between 1 and M, and H is an integer between 1 and M/3, and
    the insulation layer structure further includes second outer trenches, a respective second outer trench being along a boundary of each of the pixel regions.

14. The OLED device as claimed in claim 13, wherein the second outer trenches do not overlap each other and are spaced apart from each other.

15. The OLED device as claimed in claim 1, wherein each sub-pixel structure includes:
   a lower electrode on the insulation layer structure;
   a light emitting layer on the lower electrode; and
   an upper electrode on the light emitting layer.

16. The OLED device as claimed in claim 1, further comprising a thin film encapsulation structure on the sub-pixel structures, the substrate and the thin film encapsulation structure each having flexibility.

17. The OLED device as claimed in claim 16, wherein the thin film encapsulation structure includes:
   a first thin film encapsulation layer on the sub-pixel structures, the first thin film encapsulation layer including inorganic materials;
   a second thin film encapsulation layer on the first thin film encapsulation layer, the second thin film encapsulation layer including organic materials; and
   a third thin film encapsulation layer on the second thin film encapsulation layer, the third thin film encapsulation layer including the inorganic materials.

18. An organic light emitting display (OLED) device, comprising:
   a substrate having a display region including a plurality of sub-pixel regions;
   a respective driving transistor and a respective switching transistor on the substrate in each of the sub-pixel regions;
   an insulation layer structure on the substrate, the insulation layer structure having a respective trench surrounding the driving transistor in each of the sub-pixel regions; and
   a respective sub-pixel structure on the insulation layer structure in each of the sub-pixel regions, wherein:
   the substrate includes:
   a first organic layer;
   a first barrier layer on the first organic layer;
   a second organic layer on the first barrier layer; and
   a second barrier layer on the second organic layer, and
   a portion of an upper surface of the second barrier layer is exposed by the trench.

19. The OLED device as claimed in claim 18, further comprising a conductive layer between the second organic layer and the second barrier layer.

* * * * *